United States Patent
Vervuurt et al.

(10) Patent No.: US 10,720,337 B2
(45) Date of Patent: Jul. 21, 2020

(54) PRE-CLEANING FOR ETCHING OF DIELECTRIC MATERIALS

(71) Applicant: ASM IP Holding B.V., Almere (NL)

(72) Inventors: Rene Henricus Jozef Vervuurt, Tama (JP); Nobuyoshi Kobayashi, Kawagoe (JP); Takayoshi Tsutsumi, Nagoya (JP); Masaru Hori, Nissin (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/040,859

(22) Filed: Jul. 20, 2018

(65) Prior Publication Data

US 2020/0027746 A1 Jan. 23, 2020

(51) Int. Cl.
*H01L 21/311* (2006.01)
*H01L 21/02* (2006.01)
*H01L 21/67* (2006.01)

(52) U.S. Cl.
CPC .... *H01L 21/31116* (2013.01); *H01L 21/0206* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 2007/0080141 | A1* | 4/2007 | White | H01J 37/321 216/68 |
| 2007/0113868 | A1* | 5/2007 | Fu | H01J 37/32357 134/1.2 |
| 2007/0161214 | A1* | 7/2007 | Fompeyrine | H01L 21/28158 438/483 |
| 2015/0108472 | A1 | 4/2015 | Suzawa et al. | |
| 2015/0228495 | A1* | 8/2015 | Joubert | H01L 21/67069 438/714 |
| 2015/0270140 | A1 | 9/2015 | Gupta et al. | |
| 2016/0035581 | A1 | 2/2016 | Posseme et al. | |
| 2016/0064387 | A1 | 3/2016 | Jeong et al. | |
| 2016/0181117 | A1* | 6/2016 | Arghavani | H01L 21/31116 438/712 |
| 2016/0314986 | A1* | 10/2016 | Tominaga | H01L 21/31116 |
| 2017/0084456 | A1* | 3/2017 | Olsen | H01L 21/02046 |
| 2017/0178921 | A1* | 6/2017 | Takeda | H01J 37/32568 |
| 2017/0186621 | A1 | 6/2017 | Zaitsu | |
| 2017/0256500 | A1* | 9/2017 | Park | B23K 26/0624 |
| 2017/0345673 | A1 | 11/2017 | Ranjan et al. | |
| 2017/0345674 | A1 | 11/2017 | Ranjan et al. | |

(Continued)

OTHER PUBLICATIONS

Lee et al., Selectivity in Thermal Atomic Layer Etching Using Sequential, Self-Limiting Fluorination and Ligand-Exchange Reactions, Chem. Mater. 2016, vol. 28, pp. 7657-7665.

(Continued)

*Primary Examiner* — Shamim Ahmed
(74) *Attorney, Agent, or Firm* — Knobbe, Martens, Olson & Bear LLP

(57) ABSTRACT

An etching process is provided that includes a pre-clean process to remove a surface oxide of a dielectric material. The removal of the oxide can be executed through a thermal reaction and/or plasma process before the etch process. In some embodiments, the removal of the oxide increases etch process control and reproducibility and can improve the selectivity versus oxides.

27 Claims, 10 Drawing Sheets

(56) References Cited

U.S. PATENT DOCUMENTS

2018/0337138 A1* 11/2018 Luu .................. H01L 21/76877
2018/0350620 A1* 12/2018 Zaitsu ............... H01L 21/30621

OTHER PUBLICATIONS

Lee et al., Thermal Atomic Layer Etching of Titanium Nitride Using Sequential, Self-Limiting Reactions: Oxidation to TiO2 and Fluorination to Volatile $TiF_4$, Chem. Mater. 2017, vol. 29, pp. 8202-8210.
Office Action dated Jul. 11, 2019 in U.S. Appl. No. 16/041,044.
Sherpa, S. et al. Quasi-atomic layer etching of silicon nitride, J. Vac Sci Technol. vol. 35 (1), pp. A102-1-A102-6, (2017).
Sherpa, S. et al. Quasiatomic layer etching of silicon nitride with independent control of directionality and selectivityJ. Vac Sci Technol. vol. 35 (5), pp. 05C310-1-05C310-8, (2017).
Office Action dated Dec. 4, 2019 in U.S. Appl. No. 16/041,044.
Notice of Allowance dated Mar. 12, 2020, issued in U.S. Appl. No. 16/041,044, 9 pages.
Notice of Allowability dated Mar. 24, 2020, issued in U.S. Appl. No. 16/041,044, 3 pages.

\* cited by examiner

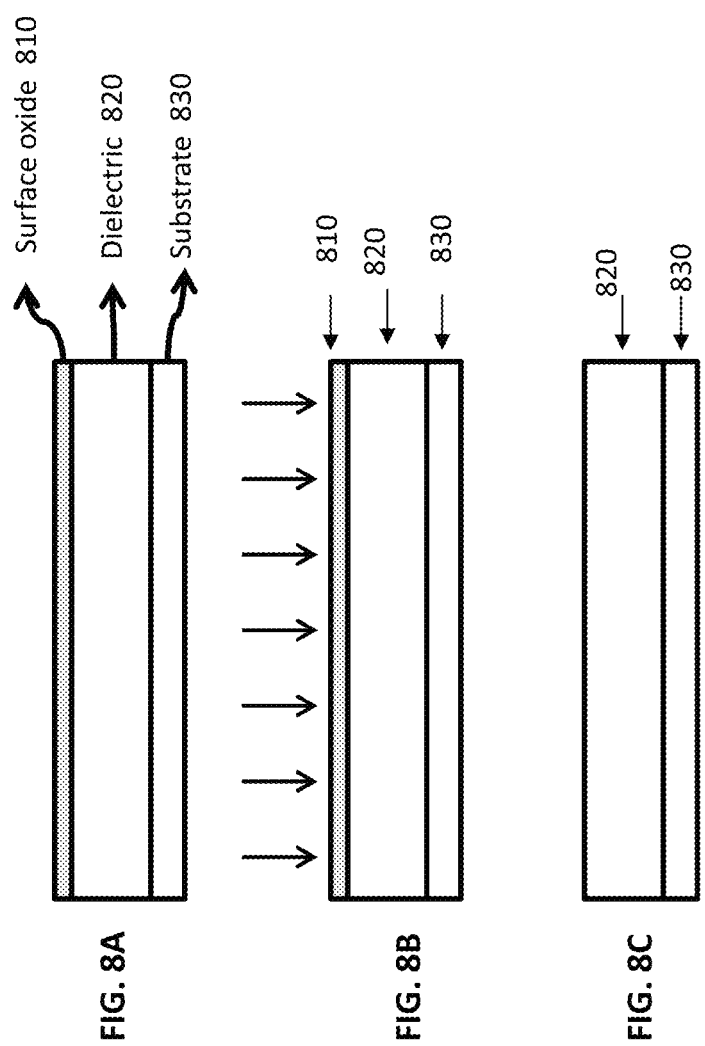

PRE-CLEANING FOR ETCHING OF DIELECTRIC MATERIALS

FIELD OF THE INVENTION

The present application relates to dry etch processing of dielectric materials.

BACKGROUND

There are a variety of ways in which to etch or remove material from the top of a material, such as a dielectric layer. One such process is atomic layer etching, which can include both dry and wet layer etching.

SUMMARY OF THE INVENTION

In some embodiments an etch process is provided that includes pre-cleaning a dielectric material to remove a surface oxide to provide a pre-cleaned dielectric surface and then performing one or more rounds of etching the pre-cleaned surface In some embodiments, a highly uniform and selective cyclic dry etch process can be performed by cyclic etch by adding a pre-clean process to remove a surface oxide of the dielectric material. The removal of the oxide can be executed through thermal reaction and/or plasma process before the dry etch process. The removal of the oxide increases cyclic etch process control and reproducibility and can improve the selectivity of etching a surface that contains oxide versus without oxide. After the pre-clean process, a dry etch process can occur on the pre-cleaned dielectric surface. The process can be repeated in any number of rounds.

In some embodiments, there is no break in vacuum between the pre-clean process and the dry etch process. In some embodiments, the dry etch process comprises cyclic dry etching. In some embodiments, pre-cleaning comprises a fluorine or chlorine containing plasma treatment to remove a surface oxide and the dry etching comprises at least one round of $H_2$ plasma treatment and fluorine or chlorine containing radical treatment.

In some embodiments, the pre-clean process is sufficient (e.g., conducted for long enough or repeated enough times) to achieve at least one of the following: (a) a superior etch profile control, (b) enhanced etch selectivity between different dielectric materials and oxides, (c) consistent etch thickness per cycle of cyclic dry etching, (d) cyclic etching of SiN, SiC, and SiCOH, with selectivity of etching between each, or (e) reduced surface and sidewall roughness.

In some embodiments, a film on a substrate is etched in a reaction chamber by cyclic etch comprising one or more cycles. In some embodiments, the etching is dry etching involving at least one round of dry etching. In some embodiments, the dry etching comprises one or more rounds of providing a $H_2$ plasma and providing a fluorine or chlorine containing plasma. In some embodiments, the cyclic dry etch process comprises repeated cycles of fluorination or chlorination and ligand exchange with a first reactant gas and repeated cycles of modification by thermal reaction with a second reactant gas and etching by thermal reaction with fluorine or chlorine containing gas. In some embodiments, the first reactant gas can be a fluorine containing gas. For example, the fluorine-containing gas can comprise HF or $XeF_2$. In some embodiments, the second reactant gas can also be a fluorine containing gas. For example, the fluorine-containing gas can comprise HF or $XeF_2$, and the chlorine containing gas can comprise $BCl_3$, $CCl_4$ or $SOCl_2$. In some embodiments, the first reactant gas can be the same as the second reactant gas. In some embodiments, the first reactant gas can be different from the second reactant gas. The reactants can be removed from the reaction chamber, such as by purging with an inert gas. The cyclic dry etching may be repeated until a desired level of etching has been obtained. In some embodiments, HF surface oxide removal can also be done wet chemically outside of the system In some embodiments, the surface oxide that is to be removed during the pre-clean can comprise silicon oxide or metal oxide. In some embodiments, the cyclic dry etching may comprise repeated cycles of fluorine containing film (CxFy) deposition and irradiation by Ar ions and/or other inert ions such as He. In some embodiments, the surface oxide may comprise a metal oxide. For example, the metal oxide may comprise a group consisting at least one of titanium oxide, hafnium oxide, tungsten oxide, molybdenum oxide, aluminum oxide and zirconium oxide.

In some embodiments, pre-cleaning comprises a thermal reaction with a reactant gas. In some embodiments, pre-cleaning further comprises a plasma-assisted process comprising fluorine or chlorine ions or radicals. In some embodiments, pre-cleaning further comprises a plasma-assisted process comprising ions with sufficient energy to sputter the surface oxide.

In some embodiments, the temperature of the dielectric material is nearly equal to the deposition temperature of the dielectric material or lower where the pre-cleaning is conducted in the same reactor used for the dielectric material deposition. In some embodiments, the pressure of the atmosphere is nearly equal to the deposition pressure of the dielectrics material or less where the pre-cleaning is conducted in the same reactor used for the dielectric material deposition. In some embodiments, the cyclic dry etching process further comprises providing a dielectric film prior to the pre-clean process. In some embodiments, the dielectric material comprises silicon. For example, the dielectric material may comprise at least one of SiN, SiON, SiC, SiCN, SiCO, SiCOH, or SiCON. In some embodiments, the dielectric material comprises a metal. For example, the dielectric material may comprise at least one of TiN, TiC, HfN, HfC, WC, WN, MoC, MoN, AlN, AlC, ZrN, or ZiC.

In some embodiments, the dielectric material can be present on a recess pattern. The recess pattern can comprise trenches having a width of 5 nm to 1000 nm and an aspect ratio of 1 to 100. In some embodiments, the dielectric film has a thickness of 100 nm or less.

BRIEF DESCRIPTION OF THE DRAWINGS

FIGS. 8A-8C illustrate cross-sectional views of substrates according to some embodiments provided herein.

DETAILED DESCRIPTION OF THE PREFERRED EMBODIMENT

Figure 1:
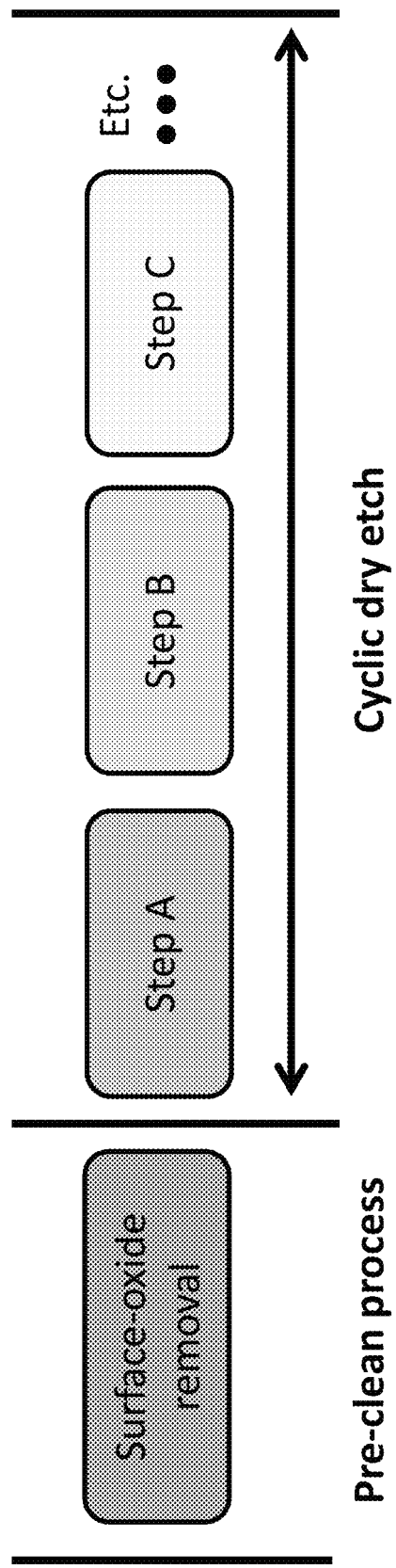
FIG. 1 illustrates a pre-clean process before cyclic dry etch process.

Cyclic etching of dielectric materials is often hindered by the presence of a surface oxide on top of these materials. The surface oxide layers can be formed due to air exposure from the oxygen containing atmosphere as well as other conditions difficult to control. In some embodiments, the surface oxide involves nitrogen or carbon when the dielectric material is nitride or carbide of silicon and metal. The presence of the surface oxide can reduce EPC (etched thickness per cycle) and degrade the etch selectivity especially between the dielectric material and oxide.

Provided herein are methods for a cyclic dry etch process that can comprise a pre-clean process and at least one etching process. The pre-clean process comprises removing a surface oxide from a dielectric material to provide a pre-cleaned dielectric material.

In some embodiments, the pre-clean process can be achieved by a thermal reaction, or a plasma process, or a combination of a thermal reaction and a plasma process. In some embodiments, the pre-clean process comprises a thermal reaction with a reactant gas. For example, the reactant gas can be a fluorine-containing gas. For example, the fluorine-containing can be HF, $XeF_2$, or a combination of HF and $XeF_2$. In some embodiments, the HF reactant denotes the wet chemical etching of the oxide before transferring the wafer to the reactor. In some embodiments, the thermal reaction comprises repeated cycles of fluorination and ligand exchange with the reactant gas. In some embodiments, the pre-clean process comprises a plasma process, and can be a plasma-assisted process. For example, the plasma-assisted process can be a $SF_6$ plasma treatment. In some embodiments, the plasma-assisted process comprises fluorine ions and radicals. In some embodiments, the reactant gas can be a chlorine containing gas.

In some embodiments, the pre-clean process is sufficient to achieve at least one of the following: a) superior etch profile control, b) enhanced etch selectivity between different dielectric materials and oxides, c) consistent etch thickness per cycle of cyclic dry etching, d) cyclic etching of SiN, SiC, and SiCOH, with selectivity of etching between each, or e) reduced surface and sidewall roughness. In some embodiments, the superior etch profile is at least as smooth as that shown in FIG. 6B, as compared to FIG. 6A. The reduction of surface roughness is quantitatively confirmed by AFM (Atomic Force Microscopy). In some embodiments, the enhanced etch selectivity is at least as good as that shown in FIG. 5, e.g., a) SiO vs SiCOH, SiC, and/or SiN; or b) SiCOH vs. SiC, vs. SiN.

ALE utilizes sequential pulses of vapor phase reactants to remove material from a substrate in each reaction cycle. In some embodiments up to a monolayer of material is removed in each etch cycle. A sub-monolayer or more of material can be removed from a substrate by ALE processes comprising contacting the substrate surface in a reaction space with at least one vapor-phase reactant. The ALE can follow the pre-cleaning process noted herein for a superior product. In some embodiments, the ALE is a dry etch process. In some embodiments, the ALE is a wet etch process.

In some embodiments, the substrate comprises a dielectric layer on which a pre-clean process is performed to remove a surface oxide from the surface of the dielectric layer. In some embodiments, the method can include applying the dielectric layer to the substrate to provide a dielectric material on the substrate.

In some embodiments, the dielectric layer can comprise silicon or a metal. For example, the dielectric layer may comprise one or more of SiN, SiON, SiC, SiCN, SiCO, SiCOH, or SiCON. For example, the dielectric layer may comprise one or more of TiN, TiC, HfN, HfC, WC, WN, MoC, MoN, AlN, AlC, ZrO or ZrC. In some embodiments, the surface oxide to be removed may comprise a silicon oxide or a metal oxide. In some embodiments, the metal oxide to be removed can be selected from at least one of: titanium oxide, hafnium oxide, tungsten oxide, or molybdenum oxide. In some embodiments, any oxide can be removed from the surface of the dielectric layer via the pre-cleaning process.

In some embodiments, the dielectric layer is present on a recess pattern. In some embodiments, the recess pattern can comprise trenches having a width of between 10 nm and 100 nm. For example, the recess pattern may comprise trenches having a width of 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1000 nm, or more. The recess pattern may comprise trenches having a width of less than 10 nm. The recess pattern may also comprise trenches having a width of more than 100 nm. In some embodiments, the recess pattern can have an aspect ratio of between 1 and 10. For example, the recess pattern can have an aspect ratio of 1, 2, 3, 4, 5, 6, 7, 8, 9, or 10. In some embodiments, the width and the aspect ratio is dependent on the application area. For example, the width ranges from 5 nm to 100 nm and the aspect ratio from 2 to 100 corresponds to nanometer-level logic and memory devices, and the width ranges from 100 to 1000 nm and the aspect ratio from 1 to 100 corresponds to TSV (Through Silicon Via) for connecting nanometer-level devices in three dimensions.

In some embodiments, during pre-cleaning and/or etching, the dielectric material can have a temperature of 100° C. or lower. For example, the dielectric material can have a temperature of 100° C., 90° C., 80° C., 70° C., 60° C., 50° C., 40° C., 30° C., 20° C., or 10° C. In some embodiments, the pressure of the atmosphere can be 10 Pa or less. For example, the pressure can be 10 Pa, 9 Pa, 8 Pa, 7 Pa, 6 Pa, 5 Pa, 4 Pa, 3 Pa, 2 Pa, 1 Pa, 0.5, or 0.1 Pa. In some embodiments, the initial dielectric material can have a thickness of 20 nm or less. For example, the dielectric material can have a thickness of 20 nm, 15 nm, 10 nm, 5 nm, 1 nm or a thickness less than 1 nm. In some embodiments, during the pre-cleaning, 100 MHz is used, for example, 200, 190, 180, 170, 160, 150, 140, 130, 120, 110, 100, 90, 80, 70, 60, 50, 40, 30, 20, 15, 10, or 5 MHz is used with CCP (Capacitor Coupled Plasma)-type reactor In some embodiments, during the pre-cleaning, 100 W is used, for example, 200, 190, 180, 170, 160, 150, 140, 130, 120, 110, 100, 90, 80, 70, 60, or 50 W is used. In some embodiments, 0 W bias is present during the pre-cleaning. In some embodiments, some bias is present during the pre-cleaning. In some embodiments, the temperature of the dielectric material is nearly equal to the deposition temperature of the dielectric material or lower where the pre-cleaning is conducted in the same reactor used for the dielectric material deposition. In some embodiments, the pressure of the atmosphere is nearly equal to the deposition pressure of the dielectrics material or less where the pre-cleaning is conducted in the same reactor used for the dielectric material deposition.

In some embodiments, similar conditions for both pre-cleaning and etching can be employed. In such embodiments, the type of plasma (CCP plasma vs Microwave plasma) can be switched to reduce the ion energy. In general, the pre-cleaning (if a plasma is used) will take place at lower pressure, higher plasma power, or even with biasing as compared to the etching. This is because generally a higher ion energy is useful in removing the surface oxide (when not chemically activated). The cyclic etch process can then be used with a lower ion energy to improve the selectivity between oxide and dielectric.

Figure 10:
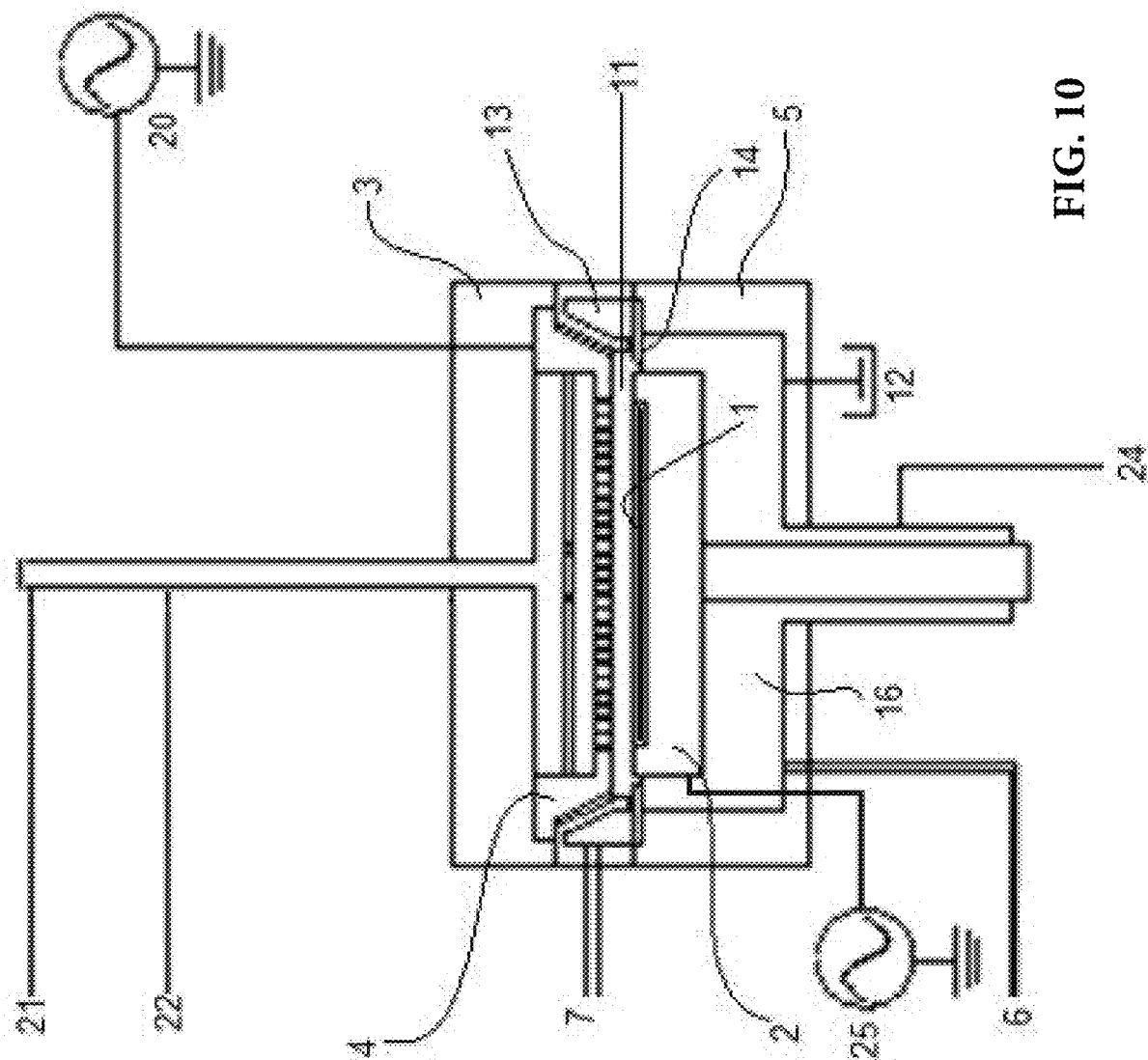
FIG. 10 is a schematic representation of an apparatus for various methods provided herein.

In some embodiments, a CCP tool can be employed for the pre-cleaning. FIG. 10 depicts a CCP-type reactor that can be used for pre-cleaning. In FIG. 10, by providing a pair of electrically conductive flat-plate electrodes 4, 2 in parallel and facing each other in the interior 11 (reaction zone) of a reaction chamber 3, applying HRF power (13.56 MHz or 27 MHz) 25 to one side, and electrically grounding the other side 12, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reactant gas and/or dilution gas, if any, and precursor gas are introduced into the reaction chamber 3 through a gas line 21 and a gas line 22, respectively, and through the shower plate 4. Additionally, in the reaction chamber 3, a circular duct 13 with an exhaust line 7 is provided, through which gas in the interior 11 of the reaction chamber 3 is exhausted. Additionally, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In addition, a substrate bias 25 is provided.

In some embodiments, the pre-cleaning with a plasma-assisted process can be conducted with inductively couple plasma (ICP), electron cyclotron resonance (ECR), or a surface-wave-sustained-type (SWP-type) reactor.

In some embodiments, the type of plasma (CCP plasma vs Microwave plasma) is switched between pre-cleaning and etching to reduce the ion energy. In some embodiments, the pre-cleaning (if a plasma is used) will take place at lower pressure, higher plasma power, and/or even with biasing. This can allow for a higher ion energy which is useful to remove the surface oxide (when not chemically activated). The cyclic etch process can then be used with a lower ion energy to improve the selectivity between oxide and dielectric.

In some embodiments, the pre-cleaning process results in removal of at least some amount of the surface oxide. In some embodiments, at least 1, 5, 10, 15, 20, 25, 30, 35, 40, 45, 50, 55, 60, 65, 70, 75, 80, 85, 90, 95, 96, 97, 98, 99, 99.9, 99.99% or greater of the surface oxide layer is removed by the pre-cleaning. In some embodiments, effectively all of the surface oxide is removed. In some embodiments, about 100% of the material is etched. In some embodiments, sufficient amount of the surface oxide is removed such that further pre-cleaning does not provide any increased effectiveness of a subsequent etching process.

In some embodiments, the pre-clean process comprises a plasma-assisted process comprising ions with sufficient energy to sputter the surface oxide.

In some embodiments, following the pre-clean, one removes excess reactants from the reaction chamber prior to the dry etch process. In some embodiments, the reaction chamber is purged between the pre-clean process and the etch process.

After the pre-clean, an etch process (e.g., cyclic etch, dry etch, wet etch, ALE, etc.) can occur. In some embodiments, there is no break in vacuum between the pre-clean process and the etch process. The process can occur by using the clustering reactor system between the pre-clean and etching reactors. In some embodiments, the pre-clean process can occur in the same reactor where the etch process is conducted. In some embodiments, there is a break in vacuum between the pre-clean process and the etch process. In some embodiments, the etch process comprises a cyclic dry etching process. For example, all the dry etch process are repeated any number of times. For example, all the dry etch processes are repeated two, three, four, five, six seven, eight, nine, ten, or more times. In some embodiments, the dry etch process comprises one cycle of dry etch.

In some embodiments, the dry etch process comprises a plasma process. For example, the plasma process can comprise a $H_2$ plasma treatment and fluorine containing plasma treatment. For example, the plasma process can comprise a $H_2$ plasma treatment and a fluorine ions or radical treatment. For example, the fluorine ions or radical treatment can comprise $SF_6$ ions or radical treatment.

In some embodiments, the dry etch process comprises repeated cycles of modification by thermal reaction with a reactant gas and etching by thermal reaction with fluorine containing gas. In some embodiments, the dry etch process comprises repeated cycles of modification can be repeated cycles of fluorine containing film (CxFy) deposition by plasma process and plasma irradiation using Ar, He or other inert ions and radicals.

Additional embodiments or variations relating to cyclic etch processing following the pre-clean process that can be combined in any of the pre-clean involved processes provided herein and are further outlined, later, in the text below.

FIG. 1 illustrates a pre-clean process that removes a surface oxide before a cyclic dry etch process. The cyclic dry etch process can comprises any number of steps (e.g., step A, step B, step C and other steps) that can be repeated any number of times (or rounds, e.g., 1, 10, 20, 30, 40, 50 or more rounds). In some embodiments, the process is repeated until the desired layer thickness reduction (etch) is achieved. The pre-clean process and the cyclic dry etch process may improve the etch profile control and enhance etch selectivity between various dielectric materials and oxides.

Figure 2:
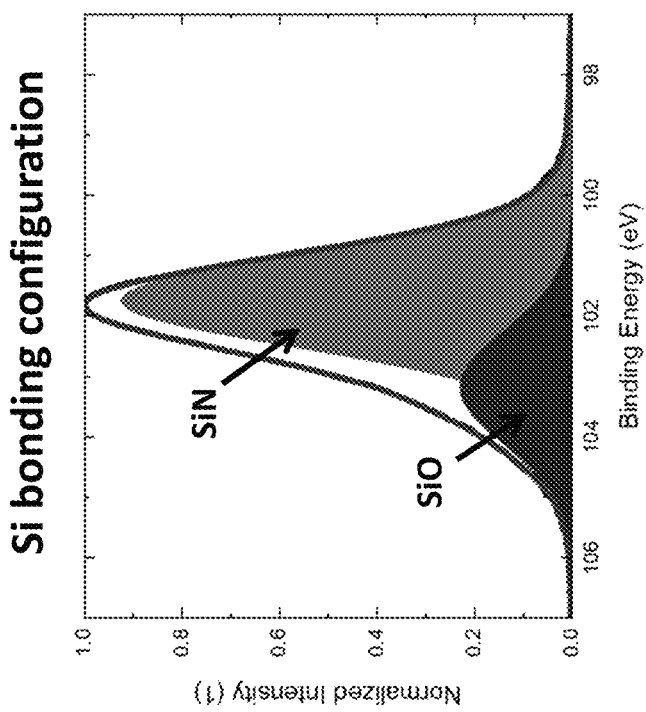
FIG. 2 illustrates an XPS spectrum of Si bonding configuration for SiN. It shows the presence of a surface oxide.

FIG. 2 is an XPS spectrum image of Si bonding configuration for SiN. It shows the presence of a surface oxide that can be removed by the processing according to an embodiment the disclosed technology.

Figures 3A, 3B:
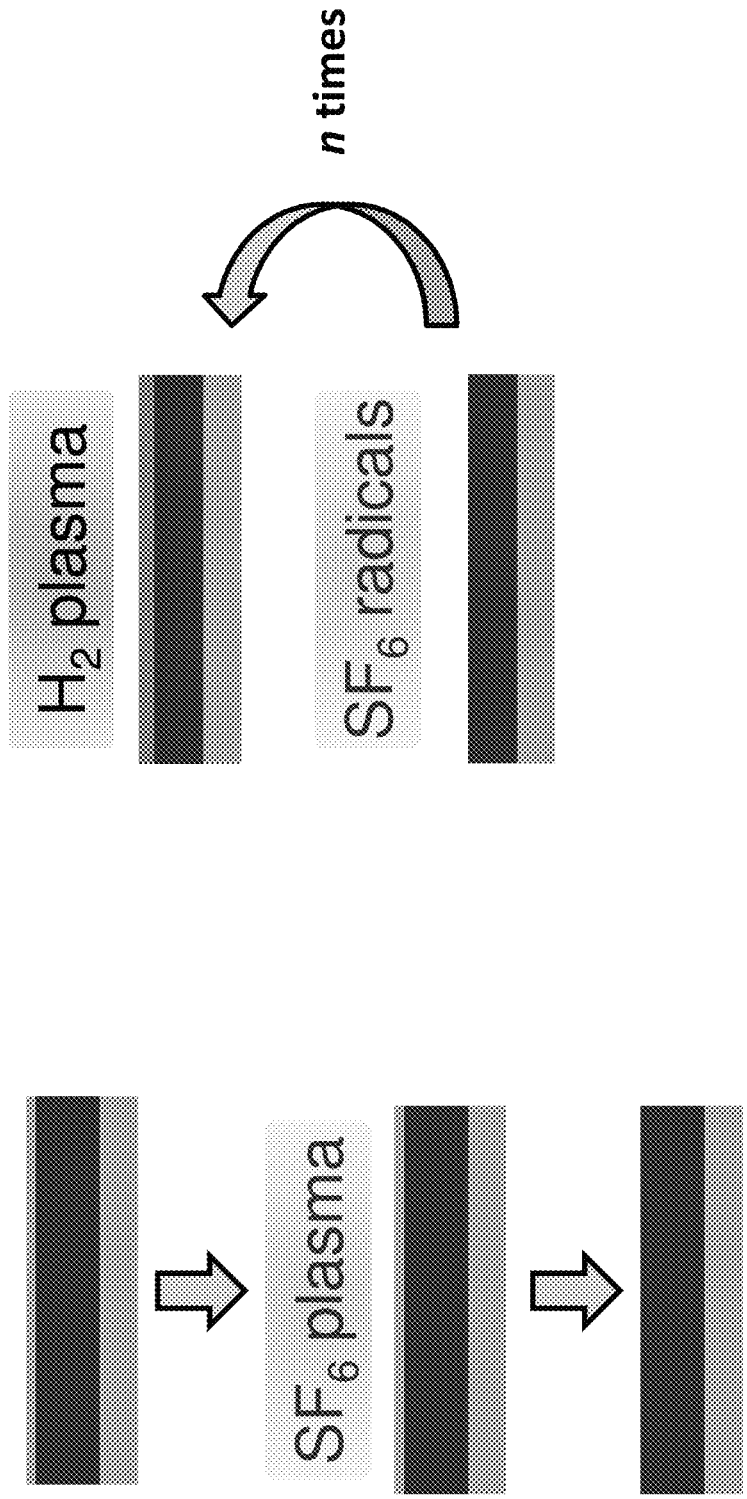
FIG. 3A illustrates a pre-cleaning process of the cyclic dry etch process of SiN using $H_2$ and $SF_6$ plasma.
FIG. 3B illustrates the dry etch process of the cyclic dry etch process of SiN using $H_2$ and $SF_6$ radicals (plasma) which can be repeated any number of times ("n").

FIG. 3A illustrates some embodiments involving a first pre-cleaning process of the cyclic dry etch process of SiN using $H_2$ and $SF_6$ plasma. The first pre-cleaning process comprises removing surface oxides from a $Si_3N_4$ substrate by treating the $Si_3N_4$ substrate with a $SF_6$ plasma. The $SF_6$ plasma can come from a capacitively coupled plasma (CCP)

source and can be applied at 100 MHz, 100 W, 2 Pa, with 0 W bias. This represents some embodiments of the pre-clean process.

FIG. 3B illustrates a dry etch process of the cyclic dry etch process of SiN using $H_2$ and $SF_6$ radicals (plasma). The dry etch process comprises treating the $Si_3N_4$ substrate, after the first pre-cleaning process, with a $H_2$ plasma. The $H_2$ plasma can come from a CCP source and can be applied at, for example 100 MHz, 100 W, 2 Pa, with 0 W bias. After the $H_2$ plasma treatment, the $Si_3N_4$ substrate can be cyclically treated by $SF_6$ radicals. The $SF_6$ radicals can come from a remote plasma source and can be applied at 2.45 GHz, 50 W, and 2 Pa.

Figure 7:
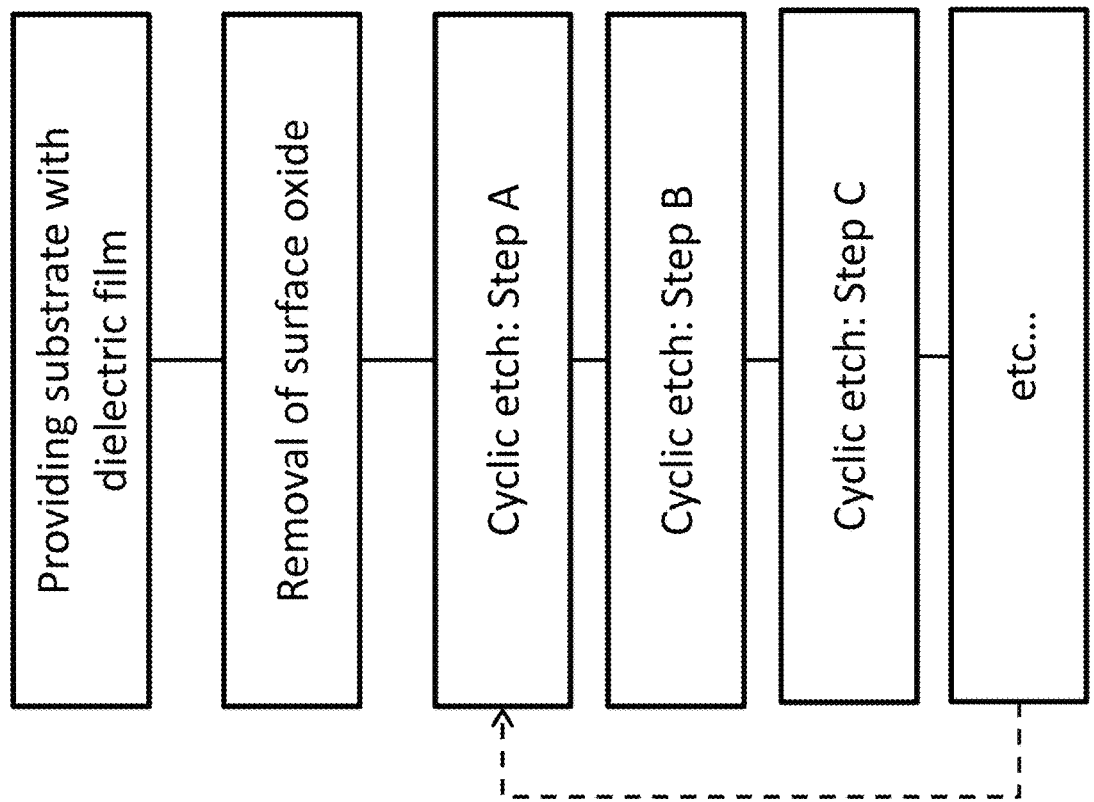
FIG. 7 is a flow chart illustrating some embodiments of processing of a substrate.

FIG. 7 illustrates a process flow diagram showing the processing of a substrate according to some embodiments of the disclosed technology. In some embodiments, a pre-clean process may comprise providing a dielectric onto a substrate and removing a surface oxide from the substrate. Subsequently, a dry etch process, which can involve any number of steps (e.g., step A, step B and step C) and can optionally be repeated any number of times, (for example, 1, 10, 100, or more times) is performed.

Figure 9A:
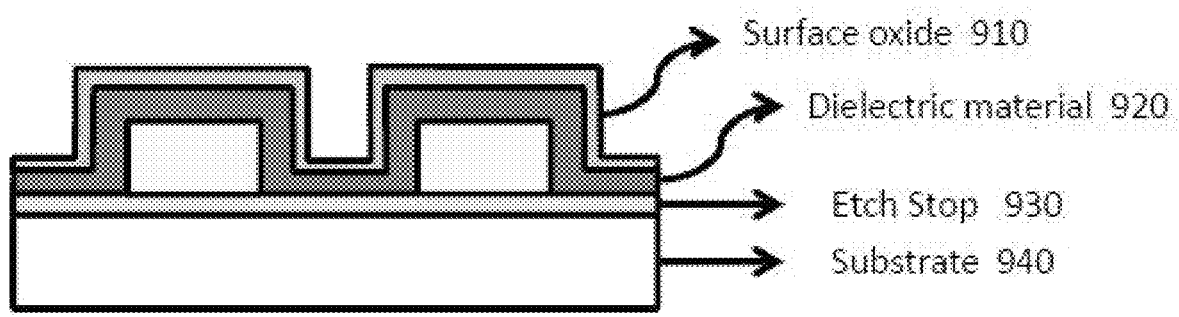
FIGS. 9A-9D illustrate cross-sectional views of substrates according to some embodiments of the disclosed technology.

FIGS. 8A-8C illustrate cross-sectional views of a Si substrate 830 going through some embodiments of the disclosed technology. FIG. 8A illustrates a material that comprises a surface oxide layer 810, a SiC layer 820, and a Si substrate layer 830. The 50 nm thick SiC layer is deposited on the Si substrate by PECVD at 300C. FIG. 8B illustrates pre-cleaning the material illustrated in FIG. 8A. The pre-cleaning using $NF_3$ plasma is conducted at 300 C in the same reactor where the SiC layer is deposited. FIG. 8C illustrates the material after the pre-clean process, in which the surface oxide layer 810 is removed and the material comprises the dielectric 820 and the substrate 830. The dielectric layer 820, can then be etched as desired by, for example, cyclic etching in the same reactor FIGS. 9A-9D illustrate cross-sectional views of substrates of going through some embodiments of the disclosed technology for $Si_3N_4$ spacer formation. FIG. 9A illustrates a material that comprises a surface oxide 910, a $Si_3N_4$ layer 920, an etch stop of SiON layer 930 and a Si substrate 940, and a hard mask of carbon layer.

The 5 nm thick SiON layer 930 was deposited on the Si substrate by PECVD, and followed by the 50 nm thick carbon layer deposition by PECVD. The carbon layer was patterned by the immersion ArF lithography and dry etch. The 20 nm thick $Si_3N_4$ layer 920 was deposited on the patterned carbon layers by ALD. The surface 910 oxide is formed during the substrate transfer to the etch reactor by air exposure.

Figure 9B:
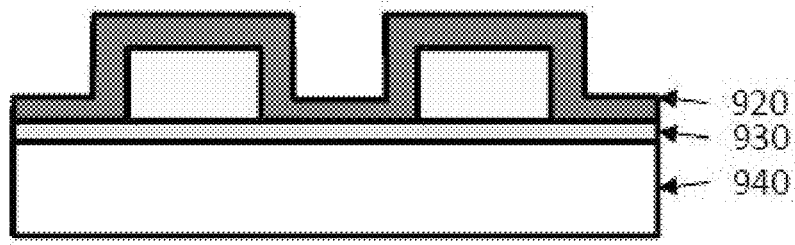
Figure 9C:
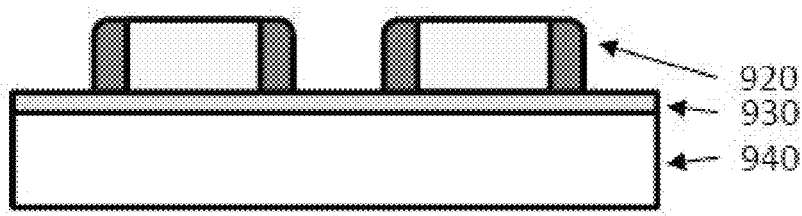
Figure 9D:
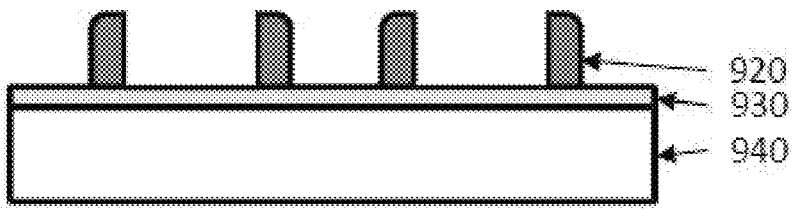

FIG. 9B illustrates the material after the pre-cleaning process of $SF_6$ plasma, in which the surface oxide 910 has been removed. FIG. 9C illustrates the $Si_3N_4$ layer after an asotropic cyclic etch process of $SF_6$ radicals, after which the S3N4 layer 920 has been partially and selectively etched away. FIG. 9D illustrates the Si3N3 spacer after another etch process using $O_2$ plasma, after which the carbon layer is further partially and selectively etched away. By combining the cyclic etch and etch processes using the different etch selectivity, $Si_3N_4$ spacers with a smooth surface and an excellent-controlled dimension are formed.

Additional Embodiments Relating to Cyclic Etch Aspects

In some embodiments, the cyclic etch methods disclosed herein are thermal etching processes, as opposed to plasma etching processes. Thus, plasma reactants need not be used in the etch cycles. In some embodiments, the cyclic etch methods are plasma processes. Thermal etch methods can be more desirable in some situations than plasma cyclic etch methods because thermal cyclic etch methods can be less damaging to the underlying substrate. Also, thermal cyclic etch methods allow for isotropic etching of non-line of sight (NLOS) features. For example, HF vapor can remove a surface oxide on a dielectric material at low temperature <100 C.

In some embodiments, the cyclic etch processes disclosed herein (which follow the pre-clean process) utilize particular reactants or combinations of reactants that have been found to allow for controlled etching in the absence of the use of plasma. The cyclic etch can be a wet cyclic etch or a dry cyclic etch.

In some embodiments for the cyclic etch, excess first vapor phase reactant and any reaction byproducts are removed from the proximity of the substrate surface. The first vapor phase reactant and any reaction byproducts may be removed from the proximity of the substrate or substrate surface with the aid of a purge gas and/or vacuum. In some embodiments, excess reactant and/or reactant byproducts are removed from the reaction space by purging, for example, with an inert gas. In some embodiments, the substrate may be moved in order to facilitate removal of the reactant and/or reactant byproducts from the vicinity of the substrate or substrate surface, for example, by moving the substrate to a different reaction chamber.

Due to the use of vapor phase reactants, the conformality of the etching process can be very good, and material can be removed evenly from all surfaces of a three-dimensional structure. In some embodiments, the conformality of etching vertically is greater than about 90% and the conformality of etching horizontally is greater than about 92%. In some embodiments, conformality of etching in vertical openings is about 50% or greater, about 75% or greater, about 85% or greater, about 90% or greater, about 95% or greater, about 98% or greater, about 99% or greater, and even up to about 100%. In some embodiments, conformality of etching in openings extending horizontally (for example from vertical openings), is about 50% or greater, about 75% or greater, about 85% or greater, about 90% or greater, about 95% or greater, about 98% or greater, about 99% or greater, and even up to about 100%. In some embodiments, conformality for a 3D structure, such as a horizontal or lateral cavity, can be greater than 50%, or greater than 80%, or even greater than 90%, or even higher than 99% and even up to about 100%. Conformality can sometimes be even greater than 100%.

In some embodiments, the substrate comprising a material to be etched, such as a semiconductor workpiece, is loaded into a reaction space or reactor. The reactor may be part of a cluster tool in which a variety of different processes in the formation of an integrated circuit are carried out. In some embodiments, a flow-type reactor is utilized. In some embodiments, a cross-flow reactor is used. In some embodiments, a shower head type of reactor is utilized. In some embodiments, a space divided reactor is utilized. In some embodiments, a high-volume manufacturing-capable single wafer atomic layer deposition reactor is used. In other embodiments, a batch reactor comprising multiple substrates is used.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc. of Phoenix, Ariz. and ASM Europe B.V., Almere, Netherlands. Other commercially available reactors include those from ASM Japan K.K (Tokyo, Japan) under the tradename Eagle® XP and XP8. In some embodiments, the reactor is an etch reactor.

In some embodiments, if necessary, the exposed surfaces of the workpiece can be treated to provide reactive sites to react with the first phase of the cyclic etch process. In some embodiments, a separate treatment process is not required. In some embodiments the substrate is treated to provide a desired surface termination. In some embodiments the substrate is treated with plasma.

According to some embodiments, etch cycles may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the cycles are carried out at a temperature of about 450° C.

The pressure in the reaction chamber for the etch cycles for some embodiments can be typically from about 10E-9 torr to about 760 torr, or about 0.001 to about 100 torr. However, in some cases, the pressure will be higher or lower than this range, as can be determined by the skilled artisan given the particular circumstances. In some embodiments, a pressure of less than 2 torr is utilized. In some cases the reactor can be operated either in isothermal (such as hot-wall) or non-isothermal (such as cold-wall) conditions. In some embodiments the reactor itself does not interact with etching chemistries and may also not interact with substrates. In some cases reactor can comprise a hot-wall, cold-wall or warm-wall type of reaction chamber.

In some embodiments, the etch cycle has an average etch rate of about 0.01 to about 5 Å/cycle. Etch rate is defined as amount of material or thickness of film is removed after each cycle. In some embodiments, the average etch rate is about 0.01 to 0.1 Å/cycle or from 0.1 to about 2 Å/cycle or in some cases even higher than 2 Å/cycle. In some embodiments, the average etch rate is more than about 0.1 Å/cycle, more than about 0.5 Å/cycle, more than about 1.0 Å/cycle, more than about 2.0 Å/cycle, more than about 3.0 Å/cycle, more than about 5.0 Å/cycle, more than about 10 Å/cycle or more than about 20 Å/cycle and in some instances if continuous flow is applied with flow rate modification or the exposure times are long enough the etch rates can be more than about 30 Å/cycle, more than about 50 Å/cycle or about 100 Å/cycle. The present pre-cleaning process is not limited by any particular form of cyclic etching. In some embodiments, the plasma etch cycle can have an etch rate of about ~50 Å/cycle. In some embodiments, the modification relies on the ion implantation depth for the process. For H2 this can be several nm. In some embodiments, the EPC can be increased by increasing the substrate bias. In some embodiments, etch rates of 100 Å/cycle can be obtained. In thermal etch cycle (e.g., ALE), the etch rate can be in the 0.1-3 Å/cycle range as this relies more heavily on surface reactions.

In some embodiments the etch selectivity i.e. the ratio of material (thickness, mass or amount of atoms/molecules) removed from the desired surface/material to material removed from the non-desired surface/materials or surfaces/materials, is from more than about 2:1, more than about 3:1, more than about 5:1, more than about 7:1, more than about 10:1, more than about 15:1, more than about 20:1, more than about 30:1, more than about 50:1, more than about 100:1, more than about 1000:1, more than about 10,000:1 or greater. In some embodiments no substantial amount of material is removed from the non-desired surface/material. In some embodiments, this ratio is cyclic etch process dependent.

In some embodiments the flow of the first or second reactant can be equal to or higher than 2 sccm, can be equal to or greater than 10 sccm or sometimes even higher than 50 sccm or can be more than 100 sccm or more than 500 sccm. In some embodiments first reactant can be continuously flown into the reaction chamber while second reactant is flown intermittently.

Although in the foregoing description the invention is illustrated with reference to certain embodiments, it is not limited to these embodiments. Indeed, various modifications of the invention in addition to those shown and described herein will become apparent to those skilled in the art from the foregoing description and fall within the scope of the appended claims. All publications, patents and patent applications cited herein are hereby incorporated by reference in their entirety for all purposes to the same extent as if each individual publication, patent or patent application were specifically and individually indicated to be so incorporated by reference. Further details of the invention are provided in the following non-limiting examples.

Example 1

A SiC dielectric layer is added onto a substrate such that the substrate has a dielectric top layer. A surface oxide is removed from the dielectric layer by a thermal reaction in the first pre-clean process. This thermal reaction involves dipping the wafer in HF solution (100:1) for 5 min and drying. After the pre-clean process, the substrate is loaded into the reactor where the second dry etching process is performed. The dry etching process comprises several rounds of $H_2$ plasma treatment and $SF_6$ radical treatment. After the dry etching process, the substrate has a superior etch profile and reduced sidewall roughness.

Example 2

A dielectric SiCN substrate has a surface oxide layer. This surface oxide layer is removed by a pre-clean process involving a plasma-assisted process. The plasma assisted process involves $SF_6$ radical treatment. After the pre-clean process, without breaking vacuum, a dry etch process comprising repeated cycles of fluorine containing film (CxFy) film deposition by plasma process and plasma irradiation using fluorine ions and radicals is performed for twenty rounds. After the dry etch process, the SiCN substrate has an enhanced etch selectivity relative to oxides and a consistent etch thickness per cycle of cyclic dry etching.

Example 3

A dielectric coated substrate was treated as outlined in FIG. 3A, using $H_2$ and $SF_6$ plasma. The first pre-cleaning process removed surface oxides from a $Si_3N_4$ substrate by treating the $Si_3N_4$ substrate with a $SF_6$ plasma. The $SF_6$ plasma was from a capacitively coupled plasma (CCP) source and was be applied at 100 MHz, 100 W, 2 Pa, with 0 W bias.

Following the pre-clean, the material was dry etched, as outlined in FIG. 3B (cyclic dry etch process of SiN using $H_2$ and $SF_6$ radicals (plasma)). The dry etch process comprised treating the $Si_3N_4$ substrate, after the first pre-cleaning process, with a H$_2$ plasma. The H$_2$ plasma came from a CCP source and was applied at, 100 MHz, 100 W, 2 Pa, with 0 W bias. After the H$_2$ plasma treatment, the Si$_3$N$_4$ substrate was cyclically treated by SF$_6$ radicals. The SF$_6$ radicals came from a remote plasma source and was be applied at 2.45 GHz, 50 W, and 2 Pa.

Figure 4:
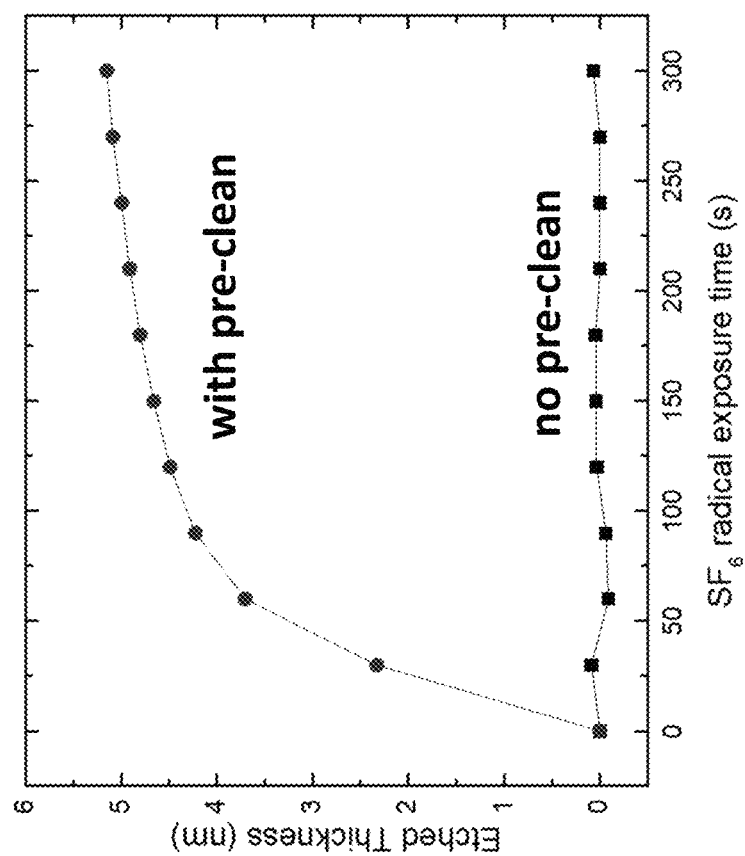
FIG. 4 is a graph illustrating a comparison between the etched thickness of SiN with a pre-clean process and the etched thickness of SiN without a pre-clean process.

FIG. 4 illustrates the resulting product as a comparison of the etched thickness of SiN with a pre-clean process and the etched thickness of SiN without a pre-clean process. When there was a native oxide present on the Si$_3$N$_4$ substrate, fluorine radicals were unable to etch the Si$_3$N$_4$ substrate after treating the substrate with H$_2$ plasma. However, when the Si$_3$N$_4$ substrate underwent a pre-clean process that removes the surface oxide, there was an increase in the etched thickness of the Si$_3$N$_4$ substrate as the time of fluorine radical exposure increases. The surface oxide present on the Si$_3$N$_4$ substrate suppressed modification layer formation and prevented the etching of the Si$_3$N$_4$ substrate. After removal of the surface oxide, a constant etched thickness per cycle of fluorine exposure was obtained. The SiN without pre-clean in FIG. 4 used the same microwave plasma, which resulted in no etch.

Figure 5:
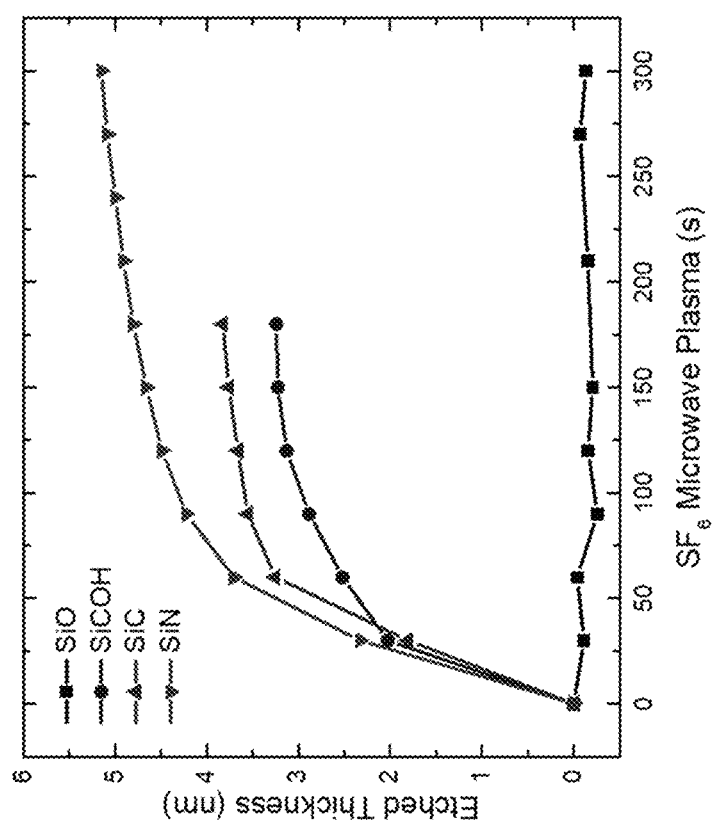
FIG. 5 is a graph illustrating the difference in etched thickness of different dielectric materials.

FIG. 5 illustrates the etched thickness of various dielectric materials. The same conditions as described above for FIG. 4 were used for SiC, SiN, SiCOH & SiO atomic layer etching with pre-clean for the results shown in FIG. 5. The dielectric materials included SiO, SiN, SiC and SiCOH. All of these dielectric materials were deposited on a Si substrate by PECVD at around 300 C. A first pre-clean process was performed to remove surface oxide. A cyclic dry-etch was then performed on the pre-cleaned dielectric surface using H$_2$ plasma and fluorine radicals. After surface oxide removal, SiN, SiC and SiCOH substrates were etched. Selectivity of these substrates differed. The selectivity can be improved by changing bias, pressure or other conditions during the etching process. For SiO substrate, a cyclic dry etch process was not possible. This illustrates the selectivity versus oxides (SiO) after the surface oxide has been removed.

Figure 6B:
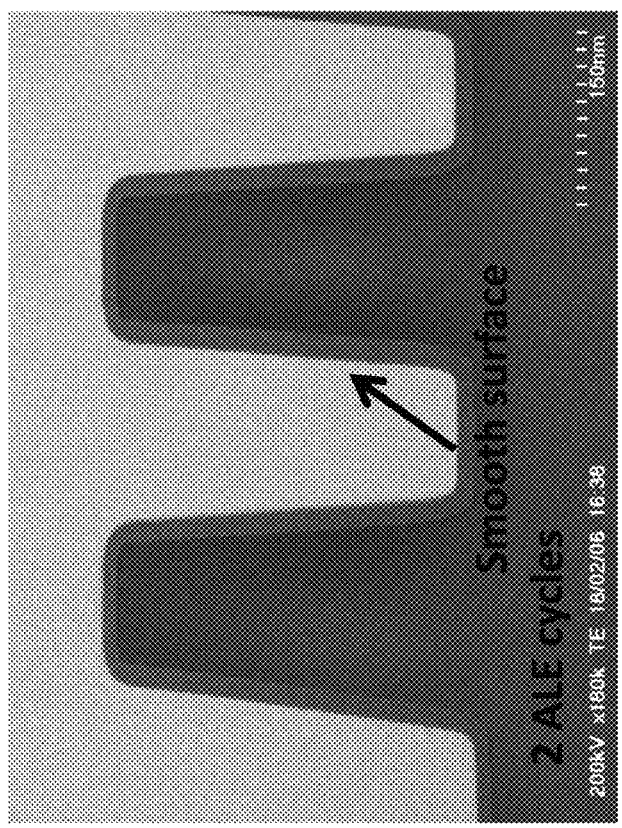
FIG. 6B is an image illustrating a $Si_3N_4$ substrate's uniformity and surface roughness with pre-clean.
Figure 6A:
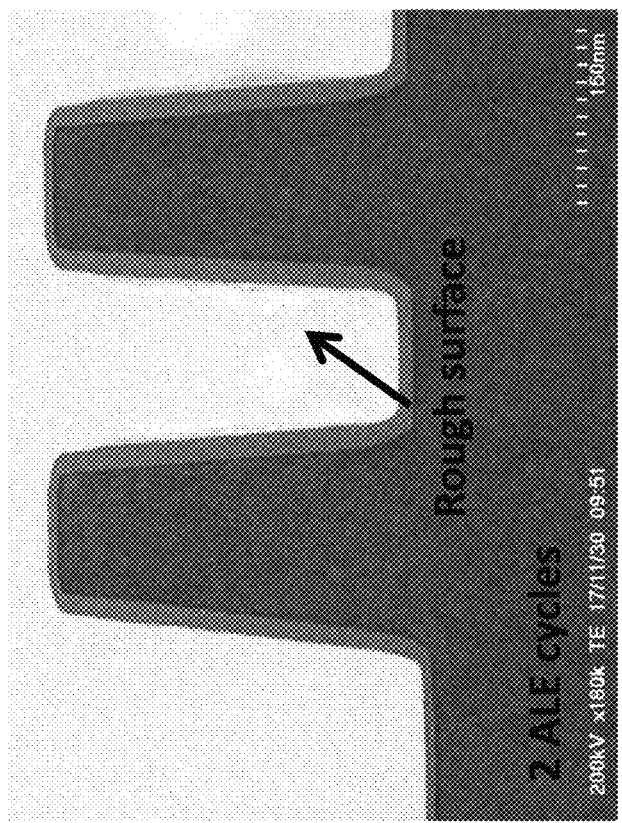
FIG. 6A is an image illustrating a $Si_3N_4$ substrate's uniformity and surface roughness without pre-clean.

FIGS. 6A and 6B are STEM photographs that show the effect of the surface oxide removal on the uniformity and roughness of a dielectric film after two repetitions of a cyclic etch process. FIG. 6A illustrates a Si$_3$N$_4$ substrate's uniformity and surface roughness without pre-clean. The surface oxide was not removed prior to the cyclic etch process. FIG. 6B illustrates a Si$_3$N$_4$ substrate's uniformity and surface roughness with pre-clean. The surface oxide was removed by a fluorine plasma etch before initiating the cyclic etch process. With the pre-clean process, the Si$_3$N$_4$ substrate as illustrated in FIG. 6B showed a smooth surface and has improved etch uniformity and reduced sidewall roughness as compared to the Si$_3$N$_4$ substrate as illustrated in FIG. 6A, which has not undergone a pre-clean process. The Si$_3$N$_4$ substrate in FIG. 6A shows a rough surface.

The SiN without pre-clean whose results are shown in FIG. 6A used a CCP SF$_6$ (50 W, 40 Pa, 0 W bias) plasma instead of a remote plasma to achieve etching of SiN even with native oxide present, but resulted in a very non-uniform etch. This is because at higher pressures >40 Pa and below 50 W the SF$_6$ CCP plasma was not as efficient in removing the surface oxide.

Throughout this application, the use of singular includes the plural unless expressly stated otherwise. In this application, the use of "or" includes "and/or", unless expressly stated otherwise. Furthermore, the terms, "include," "including," and "included," are not limiting.

What is claimed is:

1. A cyclic etch process, the process comprising:
   pre-cleaning a dielectric material to remove a surface oxide to provide a pre-cleaned dielectric surface, wherein pre-cleaning is achieved by thermal reaction and/or plasma process; and
   cyclic dry etching the pre-cleaned dielectric surface, wherein there is no break in vacuum between pre-cleaning and cyclic dry etching, wherein cyclic dry etching comprises one or more rounds of:
   providing a H$_2$ plasma; and
   providing a fluorine or chlorine containing plasma.

2. The process of claim 1, wherein pre-cleaning is sufficient to achieve at least one of the following: a) superior etch profile control, b) enhanced etch selectivity between different dielectric materials and oxides, c) consistent etch thickness per cycle of cyclic dry etching, d) cyclic etching of SiN, SiC, and SiCOH, with selectivity of etching between each, or e) reduced surface and sidewall roughness.

3. The process of claim 1, wherein cyclic dry etching further comprises:
   repeated cycles of fluorination and ligand exchange with reactant gas; and
   repeated cycles of modification by thermal reaction with reactant gas and etching by thermal reaction with fluorine or chlorine containing gas.

4. The process of claim 1, wherein the surface oxide comprises silicon oxide or metal oxide.

5. The process of claim 1, wherein cyclic dry etching further comprises repeated cycles of fluorine containing film (C$_x$F$_y$) deposition by plasma process and plasma irradiation using inert ions and radicals (Ar, He).

6. The process of claim 1, wherein pre-cleaning comprises a thermal reaction with a reactant gas.

7. The process of claim 1, wherein pre-cleaning comprises a plasma-assisted process comprising fluorine or chlorine ions or radials.

8. The process of claim 7, wherein the pre-cleaning comprises a plasma-assisted process comprising ions with sufficient energy to sputter the surface oxide.

9. The process of claim 1, wherein a temperature of the dielectric material is 50° C. or lower.

10. The process of claim 1, wherein a pressure of atmosphere is 10 Pa or less.

11. The process of claim 1, further comprising providing the dielectric material.

12. The process of claim 11, wherein the dielectric material comprises silicon.

13. The process of claim 12, wherein the dielectric material further comprises at least one of: SiN, SiON, SiC, SiCN, SiCO, SiCNO or SiCOH.

14. The process of claim 11, wherein the dielectric material comprises a metal.

15. The process of claim 14, wherein the dielectric material comprises at least one of: TiN, TiC, HfN, HfC, WC, WN, MoC, MoN, AlN, AlC, ZrN and ZrC.

16. The process of claim 11, wherein the dielectric material is present on a recess pattern.

17. The process of claim 16, wherein the recess pattern comprises trenches having a width of 5 nm to 100 nm and an aspect ratio of 2 to 100.

18. The process of claim 1, wherein the surface oxide is selected from a group consisting of at least one of: titanium oxide, hafnium oxide, tungsten oxide, and molybdenum oxide.

19. The process of claim 6, wherein the reactant gas is a fluorine gas or a chlorine gas.

20. The process of claim 19, wherein the fluorine gas comprises HF or $XeF_2$, $NbF_5$ and the chlorine gas comprises $BCl_3$, $CCl_4$ or $SOCl_2$.

21. The process of claim 16, wherein the dielectric material thickness is 20 nm or less.

22. The process of claim 1, wherein pre-cleaning comprises a $SF_6$ plasma treatment to remove a surface-oxide and wherein dry etching further comprises at least one round of $SF_6$ radical treatment.

23. The process of claim 7, wherein the plasma-assisted process is conducted in a reactor where the plasma is generated by at least one of inductively couple plasma (ICP), electron cyclotron resonance (ECR), a surface-wave-sustained-type (SWP-type) reactor, or capacitor coupled plasma (CCP).

24. The process of claim 1, wherein the pre-cleaning takes place at a lower pressure and/or higher plasma power than the cyclic dry etching.

25. The process of claim 1, wherein cyclic dry etching occurs at a lower ion energy compared to the pre-cleaning.

26. A cyclic etch process, the process comprising:
pre-cleaning a dielectric material to remove a surface oxide to provide a pre-cleaned dielectric surface, wherein pre-cleaning is achieved by thermal reaction and/or plasma process; and
atomic layer etching the pre-cleaned dielectric surface, wherein there is no break in vacuum between pre-cleaning and atomic layer etching, wherein atomic layer etching comprises one or more rounds of:
providing a $H_2$ plasma; and
providing a fluorine or chlorine containing plasma.

27. The process of claim 26, wherein atomic layer etching is performed at a temperature from about 20 to about 1200° C.

* * * * *

UNITED STATES PATENT AND TRADEMARK OFFICE
CERTIFICATE OF CORRECTION

PATENT NO.        : 10,720,337 B2
APPLICATION NO.   : 16/040859
DATED             : July 21, 2020
INVENTOR(S)       : Rene Henricus Jozef Vervuurt It is certified that error appears in the above-identified patent and that said Letters Patent is hereby corrected as shown below:

On the Title Page

On page 2, Column 1, item (56), Other Publications, Line 9, delete "selectivityJ." and insert --selectivity, J.--.

In the Specification

Column 1, Line 22, delete "surface" and insert --surface.--.

Column 2, Line 9, delete "system" and insert --system.--.

Column 4, Line 62, delete "reactor In" and insert --reactor. In--.

Column 7, Line 36, delete "reactor" and insert --reactor.--.

Column 7, Line 54, delete "asotropic" and insert --isotropic--.

Column 9, Line 56, delete "A/cycle" and insert --Å/cycle--.

Column 9, Line 58, delete "A/cycle" and insert --Å/cycle--.

In the Claims

Column 12, Line 37, Claim 7, delete "radials." and insert --radicals.--.

Signed and Sealed this
Sixth Day of October, 2020

Andrei Iancu
*Director of the United States Patent and Trademark Office*